United States Patent
Sudo

[19]

[11] Patent Number: 6,141,262
[45] Date of Patent: Oct. 31, 2000

[54] BOOSTING CIRCUIT WITH BOOSTED VOLTAGE LIMITED

[75] Inventor: Naoaki Sudo, Tokyo, Japan

[73] Assignee: NEC Corporation, Tokyo, Japan

[21] Appl. No.: 09/287,285

[22] Filed: Apr. 7, 1999

[30] Foreign Application Priority Data

Apr. 24, 1998 [JP] Japan .................................. 10-115156

[51] Int. Cl.[7] .................................................. G11C 7/00
[52] U.S. Cl. ...................... 365/189.09; 365/226; 365/241
[58] Field of Search .......................... 365/189.09, 189.11, 365/189.08, 226, 241

[56] References Cited

U.S. PATENT DOCUMENTS

| | | | |
|---|---|---|---|
| 5,426,333 | 6/1995 | Maeda | 327/536 |
| 5,612,924 | 3/1997 | Miyamoto | 365/233.5 |
| 5,777,317 | 7/1998 | Maki | 250/208.1 |
| 5,805,435 | 9/1998 | Pascucci | 363/59 |
| 5,940,333 | 8/1999 | Chung | 365/189.09 |

FOREIGN PATENT DOCUMENTS 6-28876 2/1994 Japan .
10-50088 2/1998 Japan .

OTHER PUBLICATIONS

J.C. Chen et al., "A 2.7V only 8Mbx16 NOR Flash Memory", Symposium on VLSI Circuits Digest of Technical Papers, (1996), pp. 172–173.

*Primary Examiner*—David Nelms
*Assistant Examiner*—Thong Le
*Attorney, Agent, or Firm*—Sughrue, Mion, Zinn, Macpeak & Seas, PLLC

[57] ABSTRACT

A boosting circuit includes a plurality of boosting circuit units, a voltage detecting circuit and a boost control circuit. The plurality of boosting circuit units have their outputs connected together and respectively having voltage boosting functions. Each of the plurality of boosting circuit units generates a boosted voltage higher than a power supply voltage in response to a drive signal. The voltage detecting circuit detects whether or not the boosted voltage is higher than a predetermined voltage, to generate a voltage control signal when it is detected that the boosted voltage is higher than a predetermined voltage. The boost control circuit limits the voltage boosting functions of predetermined ones of the plurality of boosting circuit units in response to the voltage control signal.

37 Claims, 6 Drawing Sheets

BOOSTING CIRCUIT WITH BOOSTED VOLTAGE LIMITED

BACKGROUND OF THE INVENTION

1. Field of the Invention

The present invention relates to a boosting circuit for generating a boosted voltage higher voltage than a power supply voltage.

2. Description of the Related Art

In any nonvolatile semiconductor memory device, it is necessary to apply a driving voltage which is higher than a power supply voltage to a corresponding word line when a read operation is performed. On the other hand, it is strongly requested to decrease the power supply voltage. For this reason, a conventional nonvolatile semiconductor memory device very often employs a boosting circuit to increase a word line voltage to a higher voltage than the power supply voltage. Also, in a DRAM, it is necessary to apply a voltage higher than the power supply voltage to the gate of a word line driving transistor so that the output voltage of the word line driving transistor or the word line voltage is set to the power supply voltage level. For the purpose, a control signal amplified by the boosting circuit is used.

As an example of such a device, a nonvolatile semiconductor memory device is disclosed in Japanese Laid Open Patent Application (JP-A-Heisei 6-28876). The nonvolatile semiconductor memory device is characterized in the following point. That is, a capacitor is provided which is electrically connected at one end to a word line selected in a read operation. When the selected word line is driven in the read operation, the voltage at the other end of the capacitor is increased from a low level to a high level to have a voltage higher than the power supply voltage at the one end of the capacitor. Then, the voltage higher than the power supply voltage is applied to the selected word line as a word line driving voltage. In brief, the word line is driven with a voltage boosted to a higher voltage than the power supply voltage by use of a boosting circuit.

Also, in the reference, other nonvolatile semiconductor memory devices are disclosed. That is, in one nonvolatile semiconductor memory device, a boosting circuit responsive to a chip-enable signal and another boost circuit are both used such that a word line driving voltage remains not to exceed a permissible level. Also, the nonvolatile semiconductor memory can cope with a lower power supply voltage. Also, in another nonvolatile semiconductor memory device, as shown in FIG. 1, the output of a boosting circuit is limited by a few stage of diodes to prevent the word line driving voltage from being increased to a undesired level.

Figure 1:
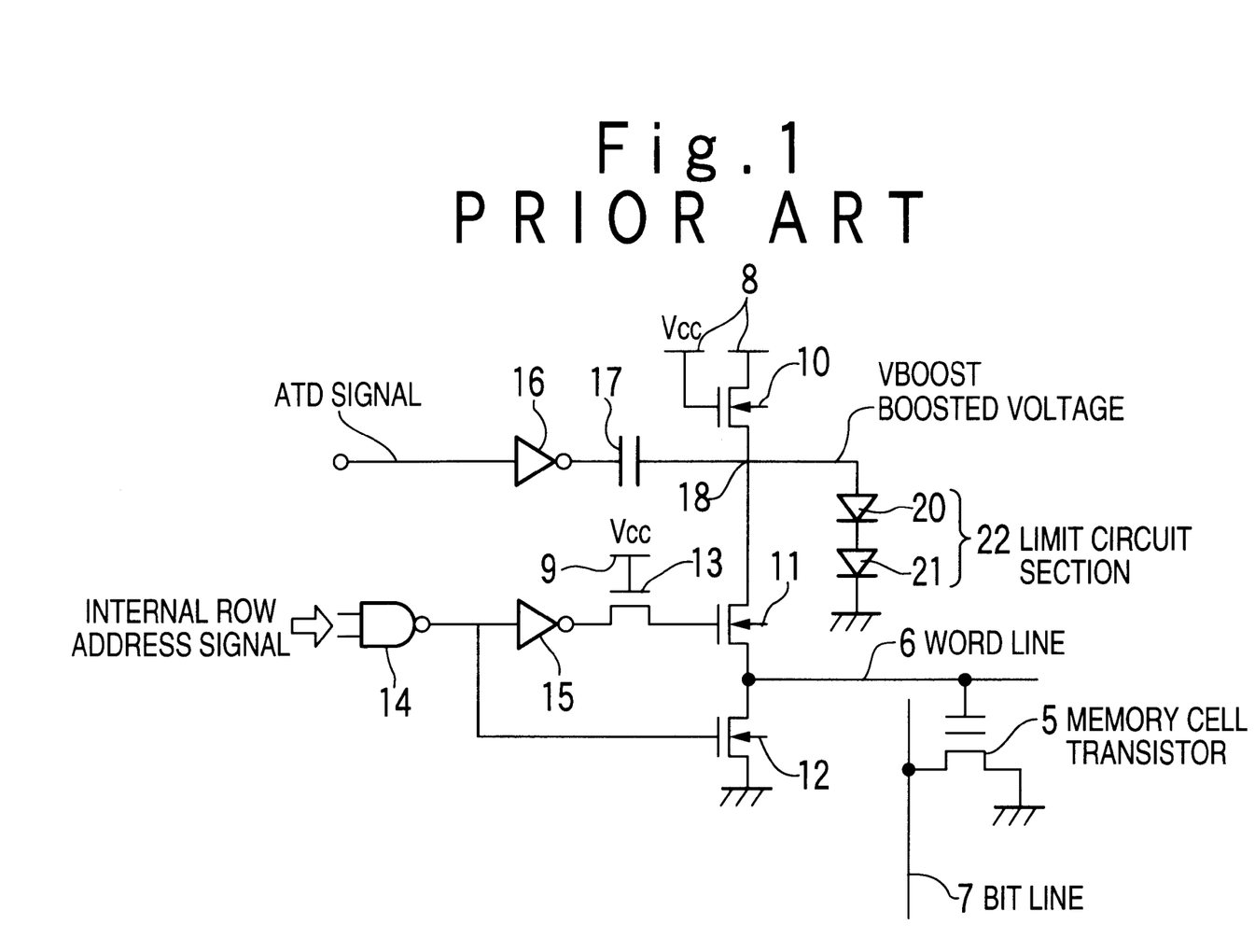
FIG. 1 is a circuit diagram showing a main portion of a conventional nonvolatile semiconductor device.

In the conventional example shown in FIG. 1, an inverter 16 and a capacitor 17 constitute a boosting circuit, and an NMOS transistor 10 and a power supply line 8 constitute a voltage switching circuit. In addition, a limit circuit section 22 is composed of two diodes 20 and 21. In this example, a node 18 is charged to a power supply voltage Vcc. When an ATD signal is inputted, the node voltage is increased to a higher voltage than the power supply voltage Vcc based on the boosting function by the inverter 16 and the capacitor 17. This is similar to the case of the circuit shown in FIG. 7. When a word line 6 has been selected based on an internal row address signal, the voltage at the node 18 is supplied to the word line 6 via the NMOS transistor 11. As a result, when the word line 6 voltage is increased to a voltage higher than a permissible voltage level, a limit circuit 22 composed of a series connected diodes 20 and 21 starts to operate to prevent the voltage at the node 18, or the voltage on the word line 6 from exceeding the permissible voltage level.

Also, in Japanese Laid Open Patent Application (JP-A-Heisei 10-50088) is disclosed the technique in which the power supply voltage is always boosted to a high voltage for a write operation or an erase operation in a nonvolatile semiconductor memory device. The high voltage is outputted in response to an enable signal, and the operations of some components of a boosting circuit are stopped when the high voltage exceeds a reference voltage.

Moreover, in "A2.7 V only 8 Mb×16 NOR flash memory" (1996 Symposium on VLSI Circuits Digest of Technical Papers, pp. 172–173) by Johnny C. Chen et al is described the technique in which a plurality of boosting circuits are provided to be possible to connect the outputs together, and when a power supply voltage to be used is generated, the desired number of boosting circuits to be connected is selected based on the power supply voltage level.

However, the above described conventional nonvolatile semiconductor memory device is not practical because the boosting circuit is only used. The excessive increase of the driving voltage on a word line cannot be suppressed. That is, when the word line voltage is too high, the current read out from a memory cell increases. When the voltage is too low, the current decreases. In both cases, a data stored in the memory will be erroneously sensed. Such a problem may be negligible when the power supply voltage to the semiconductor memory device ranges 3 V to 5 V. However, the semiconductor memory device is recently requested to operate at a wider range from 1.8 V to 5 V. For the purpose of reading out the data from the memory cell even in the wider range of power supply voltage, it is important that the boosted voltage stays within a certain voltage range.

Also, the technique for selecting the number of boosting circuits to be connected depending on a desired power supply voltage level fails to suppress a change in the boosted voltage so that a data is erroneously sensed.

The technique in which the power supply voltage is boosted in response to the enable signal cannot cope with a high speed read operation. This is because the enable signal is switched at the same time as an internal address is switched. Also, although the boosting circuit can generate a voltage two times greater than the power supply voltage, the boosting to a desired voltage requires tens of clock pulses. This will result in the power consumption for a considerable length of time.

Moreover, in the technique in which the output (boosted voltage) of the boosting circuit is limited by use of diodes, an excessive portion of charge is discharged from the output of the boosting circuit to a ground level through the diodes so that the boosted voltage does not exceed the reference voltage. As a result, some charges stored in a boost driving capacitance and a load are lost. For this reason, when the output of the inverter is set to a low level upon resetting the boosting operation, the boosted voltage drops down to a voltage lower than its initial voltage. Therefore, if a pre-charging time from the resetting operation to the next boosting operation is short, the boosted voltage hardly reaches its desired voltage and the boosting speed will be retarded. Accordingly, the nonvolatile semiconductor memory device cannot perform a high speed read operation.

SUMMARY OF THE INVENTION

It is an object of the present invention to provide a boosting circuit which can quickly produce a boosted voltage with a small drift.

Another object of the present invention is to provide a boosting circuit in which a resetting and pre-charging time can be shortened.

Still another object of the present invention is to provide a semiconductor memory device which is operable at a high speed and a high reliability by the above boosting circuit.

In order to achieve an aspect of the present invention, a boosting circuit includes a plurality of boosting circuit units, a voltage detecting circuit and a boost control circuit. The plurality of boosting circuit units have their outputs connected together and respectively having voltage boosting functions. The plurality of boosting circuit units generates a boosted voltage higher than a power supply voltage in response to a drive signal. The voltage detecting circuit detects whether or not the boosted voltage is higher than a predetermined voltage, to generate a voltage control signal when it is detected that the boosted voltage is higher than a predetermined voltage. The boost control circuit limits the voltage boosting functions of predetermined ones of the plurality of boosting circuit units in response to the voltage control signal. In this case, remaining ones of the plurality of boosting circuit units other than the predetermined boosting circuit units continue to perform the voltage boosting functions.

The plurality of boosting circuit units may be first and second boosting circuit units, and the second boosting circuit unit may be the predetermined boosting circuit unit. In this case, it is preferable that the first and second boosting circuit units include first and second capacitors used to the voltage boosting functions, and a capacitance of the first boosting circuit unit is larger than that of the second boosting circuit unit.

Also, the plurality of boosting circuit units may be first to third boosting circuit units, and the predetermined boosting circuit unit may be the third boosting circuit unit. In this case, the first to third boosting circuit units may have capacitors which have a same capacitance.

The boost control circuit may stop the voltage boosting functions of the predetermined boosting circuit units to limit the voltage boosting functions.

Also, when the boosting circuit is contained in a semiconductor memory device having word lines for a memory cell array, the drive signal may be generated in response to switching of an address, and the boosted voltage may be applied to one of the word lines corresponding to the address.

In order to achieve another aspect of the present invention, a method of boosting a voltage includes:

generating a boosted voltage higher than a power supply voltage in response to a drive signal by a plurality of boosting circuit units having their outputs connected together and respectively having voltage boosting functions;

detecting whether or not the boosted voltage is higher than a predetermined voltage, to generate a voltage control signal when it is detected that the boosted voltage is higher than a predetermined voltage; and limiting the voltage boosting functions of predetermined ones of the plurality of boosting circuit units in response to the voltage control signal.

In order to another aspect of the present invention, a boosting circuit includes:

a plurality of boosting circuit units each of which includes a capacitor, and whose outputs are connected together, wherein the capacitors are used for a voltage boosting function to generate a boosted voltage higher than a power supply voltage in response to a drive signal to charge a load capacitor;

a voltage detecting circuit for detecting whether or not the boosted voltage is higher than a predetermined voltage, to generate a voltage control signal when it is detected that the boosted voltage is higher than a predetermined voltage; and a boost control circuit for limiting the voltage boosting functions of predetermined ones of the plurality of boosting circuit units in response to the voltage control signal, such that the capacitors of the predetermined boosting circuit units are operated as an additional load capacitor to be charged with the boosted voltage.

DESCRIPTION OF THE PREFERRED EMBODIMENTS

A boosting circuit of the present invention will be described below in detail with reference to the attached drawings.

Figure 2:
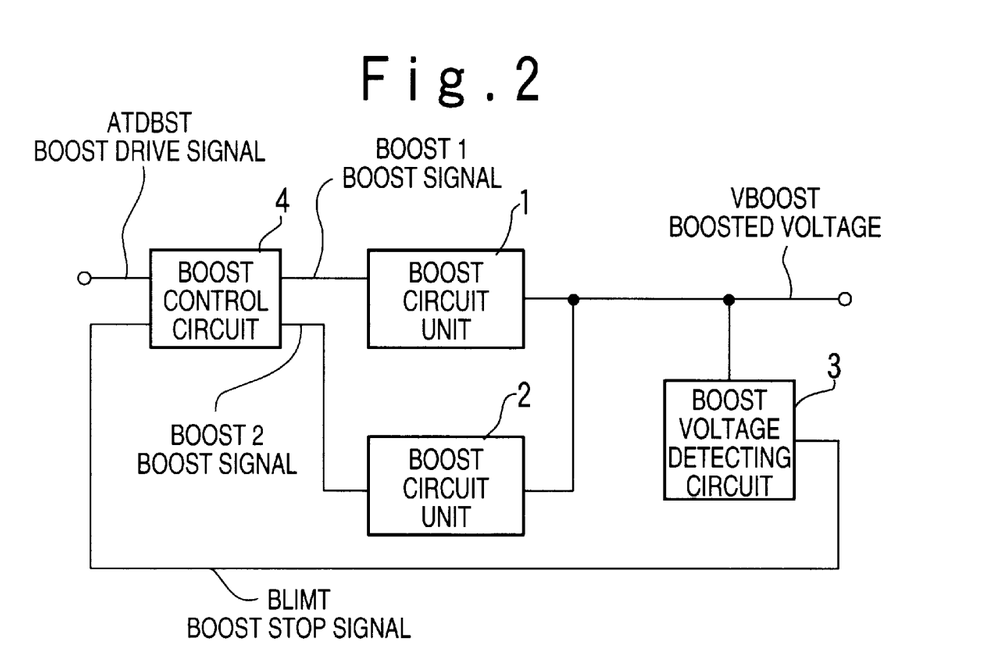
FIG. 2 is a diagram showing a boosting circuit according to an embodiment of the present invention.

FIG. 2 shows a block diagram of the boosting circuit according to an embodiment of the present invention. The boosting circuit according to the embodiment of the present invention is composed of a boost control circuit 4, a plurality of boosting circuit units 1 and 2 and a boosted voltage detecting circuit 3. The outputs of the plurality of boosting circuit units 1 and 2 are connected together. The plurality of boosting circuit units 1 and 2 performs voltage boosting functions to increase a word line voltage to a voltage higher than a power supply voltage, each time an address signal is switched or a clock or control signal supplied from a CPU is switched to a predetermined state. The boosted voltage detecting circuit 3 detects whether or not the output of the boosting circuit units is higher than a predetermined voltage. The boost control circuit 4 limits the voltage boosting functions of the boosting circuit units when the output of the boosting circuit units 1 and 2 is higher than the predetermined level.

Figure 7:
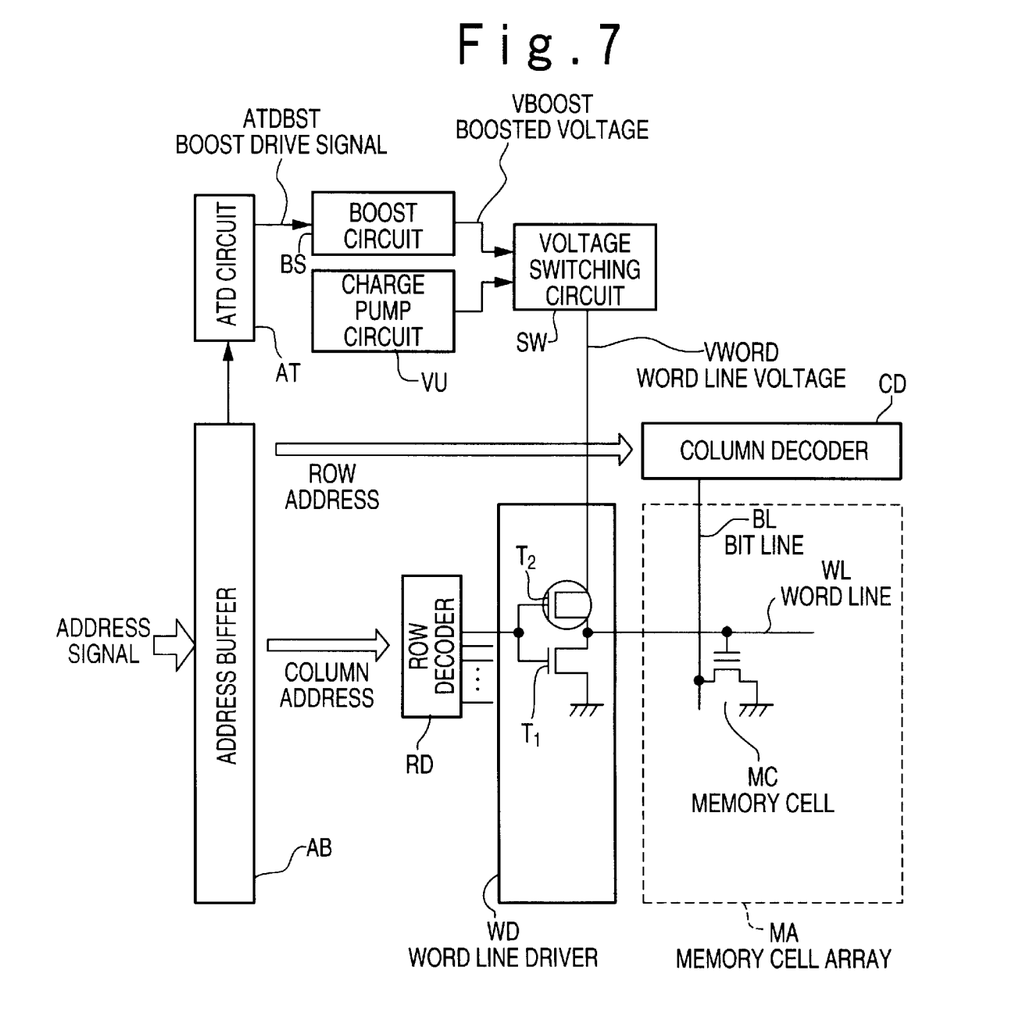
FIG. 7 is a block diagram showing a nonvolatile semiconductor memory device to which the boosting circuit according to the embodiment of the present invention is applied.

A semiconductor memory device according to an embodiment of the present invention is shown in FIG. 7. The nonvolatile semiconductor memory device is composed of a memory cell array MA, an address buffer AB, a row decoder RD, a column decoder CD, a word line driver WD, an ATD circuit AT, a boosting circuit BS, a charge pump circuit VU, and a voltage switching circuit SW.

The address buffer AB holds an address signal. The row decoder RD receives a row address from the address buffer AB to select a word line WL in a memory cell array MA. The word line driver WD outputs a desired voltage to the selected word line WL based on an output of the row decoder RD. The column decoder CD receives a column address from the address buffer AB to select a bit line BL in the memory cell array MA. The ATD circuit AT detects a change of the address signal in the address buffer AB in a read operation to generate a boost driving signal ATDBST. The boosting circuit BS generates a boosted voltage in response to the boost driving signal ATDBST. The charge pump circuit VU generates a high voltage when a write operation or an erase operation is performed to the memory cell array MA. The voltage switching circuit SW selects one of an output of the boosting circuit BS and an output of the charge pump circuit VU to supply to the word line driver WD.

The memory cell array MA may be an EPROM memory cell array in which a plurality of flash memory cells are arranged in a matrix and in which each flash memory cell is located adjacent to the intersection of a word line WL and a bit line BL. Each memory cell MC can be selected by the row decoder RD and the column decoder CD. When the write operation is performed, charge is injected to the floating gate of the memory cell MC. When the erase operation is performed, the charge is discharged.

In the read operation from a desired memory cell MC, the boosting circuit BS generates a word line voltage VWORD which is higher than the power supply voltage of the voltage switching circuit SW, and supplies to a corresponding word line WL. The word line voltage VWORD is applied to the gates of all the memory cells MC connected to the corresponding word line WL. Thus, a data of "0" (in the write operation) or "1" (in the erase operation) is read out from the selected memory cell MC on the bit line BL. It should be noted that the word line voltage VWORD is set to such a proper level that "0" and "1" of the data can be distinguished from each other at high certainty by a sense amplifier (not shown). In the write operation or the erase operation to the memory cell MC, the charge pump circuit VU performs its function.

FIG. 2 is a block diagram showing the boosting circuit according to the embodiment of the present invention. The boosting circuit substantially corresponds to the boosting circuit BS shown in FIG. 7. The boosting circuit is composed of two boosting circuit units 1 and 2, a boosted voltage detecting circuit 3, and a boost control circuit 4. The boost control circuit 4 generates two boost signals BOOST1 and BOOST2 to supply to the boosting circuit units 1 and 2, when receiving the boost driving signal ATDBST from the ATD circuit AT shown in FIG. 7. The boosting circuit units 1 and 2 cooperate to produce a boosted voltage VBOOST which is higher than the power supply voltage. When the boosted voltage VBOOST is increased to a predetermined level, the boosted voltage detecting circuit 3 activates and supplies a boost stop signal BLIMT to the boost control circuit 4. In response to the boost stop signal BLIMT, the boost control circuit 4 deactivates the boost signal BOOST2. Thus, the boosting circuit unit 2 stops its boosting function. After that, the boosting circuit unit 1 operates to maintain the boosted voltage VBOOST. As a result, the boosted voltage VBOOST can be controlled to prevent the word line voltage WL from exceeding the predetermined level in the read operation. Also, when the boost driving signal ATDBST is deactivated, the boosting circuit unit 1 stops its boosting operation and the boosted voltage returns back to the power supply voltage.

Figure 3:
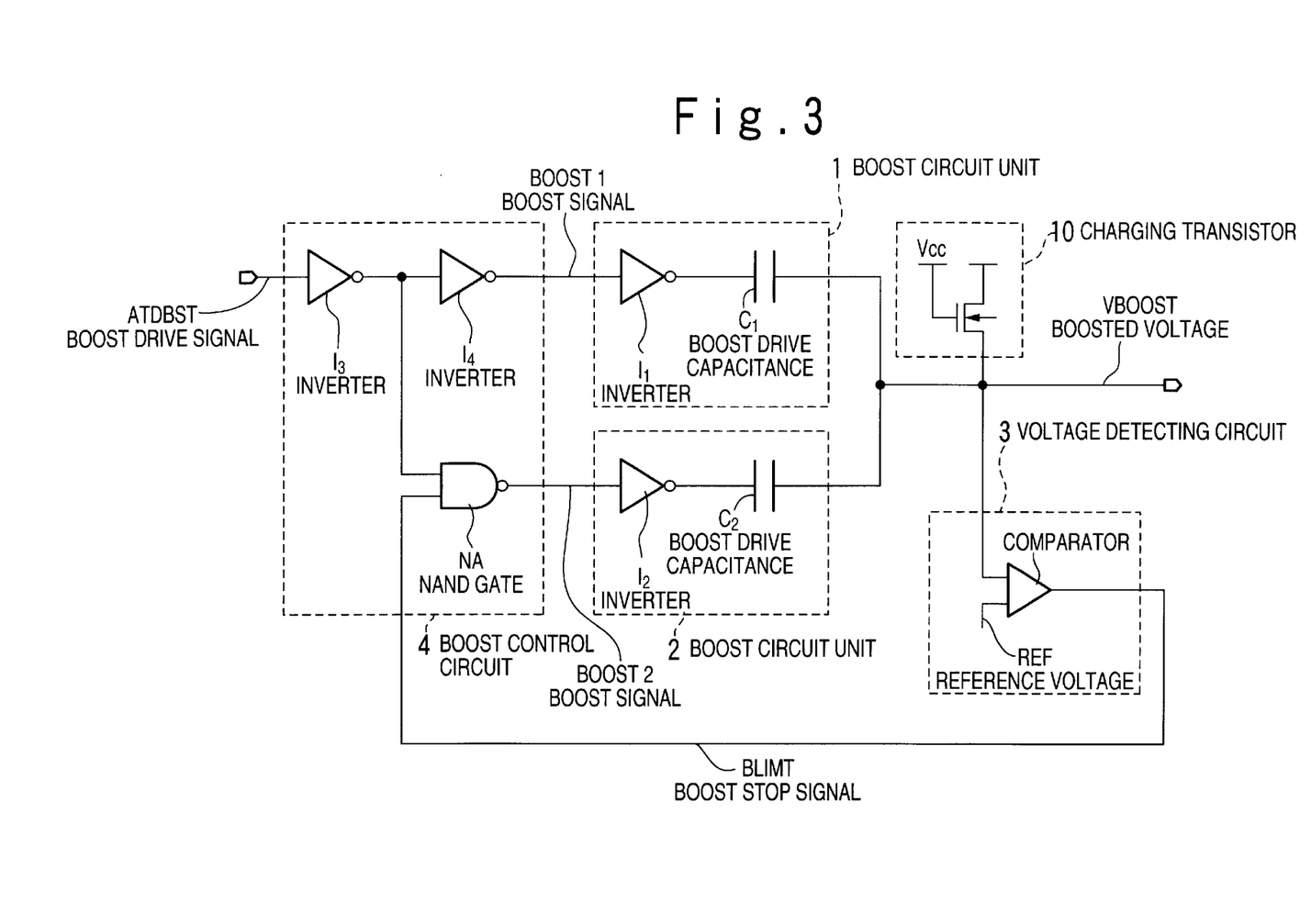
FIG. 3 is a diagram showing the detail of the boosting circuit shown in FIG. 2.

FIG. 3 is a detailed diagram of the boosting circuit shown in FIG. 2. As shown in FIG. 3, the boosting circuit units 1 and 2 have boost driving capacitors C1 and C2 and inverters I1 and I2 for driving their respective boost driving capacitors C1 and C2, respectively. Two outputs of the boosting circuit units 1 and 2 are combined to output the boosted voltage VBOOST, and are connected to a charging transistor 10. The boosted voltage detecting circuit 3 includes a comparator for comparing the boosted voltage VBOOST with a reference voltage REF. When the boosted voltage VBOOST exceeds the reference voltage REF, the boost stop signal BLIMT is activated. The boost control circuit 4 is composed of two stage of inverters I3 and I4 and a NAND gate NA. The inverters I3 and I4 in the two-stage structure transmit the boost driving signal ATDBST from the ATD circuit AT shown in FIG. 7 to the boosting circuit unit 1. The boost stop signal BLIMT and an output of the inverter I3 at the first stage are supplied to the NAND gate NA whose output is connected to the boosting circuit unit 2.

Figure 4:
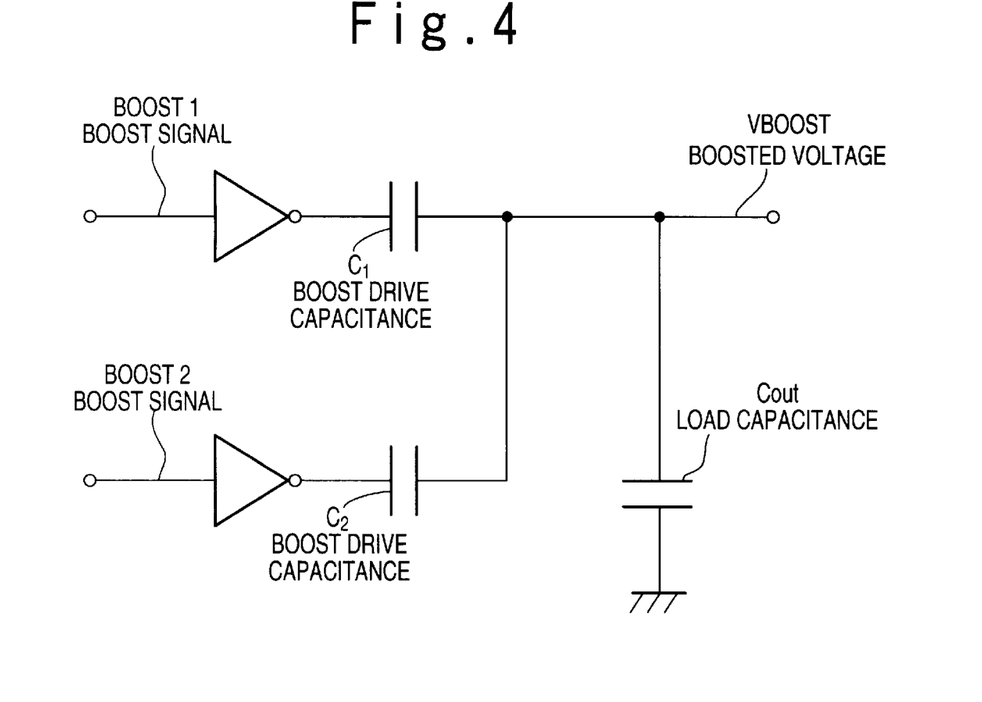
FIG. 4 is a diagram showing the relation between boosting circuit units and load capacitance in the boosting circuit shown in FIG. 3.
Figure 5:
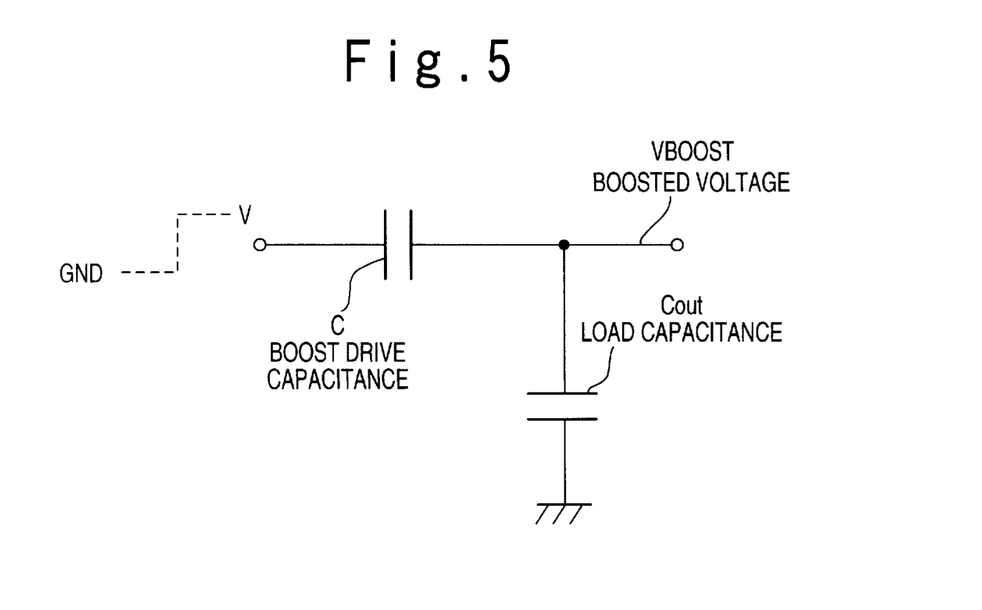
FIG. 5 is a diagram showing an equivalent circuit to that shown in FIG. 4.

The boosted voltage VBOOST is connected to the charging transistor 10, the word line driver WD, and the word line WL as shown in FIG. 7. The word line WL is connected with a plurality of memory cells MC. When a load capacitance is represented by Cout, connection of the boosting circuit units 1 and 2 in FIG. 3 and the load capacitance Cout is as shown in FIG. 4. Assuming C1+C2=C, the boosting circuit can be expressed by an equivalent circuit as shown in FIG. 5. The boosted voltage VBOOST is charged to the power supply voltage Vcc by the charging transistor 10 before the boosting function is started. When the input to the boost driving capacitor C rises from 0 to a voltage V, the boosted voltage VBOOST is expressed by the following equation (1) through the effect of capacitance division:

$$VBOOST = Vcc + \frac{C}{C + Cout}V \qquad (1)$$

It is apparent from the above equation (1) that it is necessary to increase the boost driving capacitance in order to make the boosted voltage VBOOST sufficiently higher than the power supply voltage Vcc, since the load capacitance Cout becomes large in the memory cell array MA of a large capacity. In case that a capacitor element is made of a polysilicon material and the capacitance is to be increased with a single element, as the element area is increased, the clock transfer speed of the boost driving capacitance drops so that the boosting operation speed drops. To eliminate the above problem, the boost driving capacitance C is divided into a plurality of elements which are connected in parallel, so that the parasitic resistances are reduced as low as possible.

In the present invention, the boosted voltage VBOOST is controlled not to exceed a predetermined level by changing the boost driving capacitance C. For the purpose, the boost driving capacitance C is realized by two capacitances C1 and C2, as shown in FIG. 3, and also the operation of the boosting circuit unit 2 is stopped in response to the boost stop signal BLIMT.

In the present invention, a current path in the limit circuit of two diodes 20 and 21 shown in FIG. 1 is removed in the determination of the boosted voltage VBOOST. Accordingly, the charges stored in the boost driving capacitances C1 and C2 and the load capacitor Cout are not lost. Thus, there is no case where the boosted voltage VBOOST is lowered to a voltage less than the power supply voltage Vcc after resetting of the boosting operation, so that the boosted voltage decreases if a precharge time to the next boosting operation is short. The resetting of the boosting operation means that the boosting operation is stopped and the boost driving signal ATDBST is set to the inactive state.

The relation between the two boost driving capacitances C1 and C2 is preferable to a relation of C1>C2 and it is preferable that the ratio of the boost driving capacitance C1 to the boost driving capacitance C2 is 2:1. The same effect may be given in a modification example where the boost driving capacitance is divided into three elements and the boost stop signal BLIMT is applied to one of the three elements.

The operation of the embodiment shown in FIG. 2 will be described with reference to the waveform diagram of FIGS. 6A to 6G.

For simplification of the description, it is supposed that the high level of each signal is equal to the power supply voltage Vcc and the low level is a ground voltage GND. When the nonvolatile semiconductor memory device in the embodiment is in its initial state in which the row address is not determined, a NMOS transistor T1 of the word line driver WD is turned on and a PMOS transistor T2 is turned off. Therefore, the word line WL is loaded with zero volt of the ground voltage. Also, the boosted voltage VBOOST is charged to the power supply voltage Vcc by the charging transistor 10 as described above.

Figure 6A:
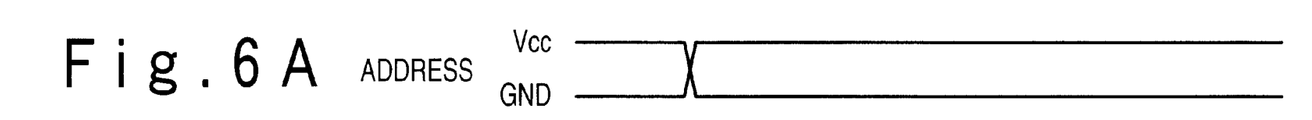
FIGS. 6A to 6G are waveform diagrams at various portions of the boosting circuit according to the first embodiment of the present invention shown in FIGS. 2 and 3.

In this state, when the row address of the internal address data of the nonvolatile semiconductor memory device in the address buffer AB is changed as shown in FIG. 6A, the corresponding NMOS transistor T1 of the row decoder RD is turned off and the corresponding PMOS transistor T2 is turned on. As a result, the word line voltage VWORD is applied to the word line WL from the charging transistor 10. In this case, the word line voltage VWORD is Vcc.

It should be noted that the two boosting circuit units 1 and 2 are adopted in this embodiment. However, the present invention is not limited to this. The number of boosting circuit units may be three or more. For example, three boosting circuit units having the same boost driving capacitance are provided and the boost function of one of the three boosting circuit units may be stopped in response to the boost stop signal BLIMT.

Figure 6B:
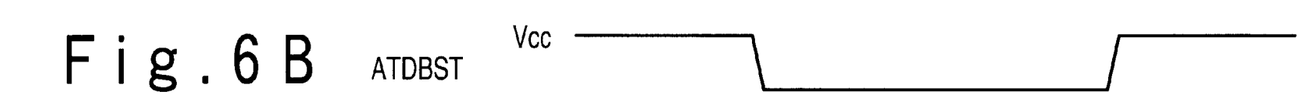

After the NMOS transistor T1 and the PMOS transistor T2 are inverted, the ATD circuit AT activates the boost driving signal ATDBST with a small delay, as shown in FIG. 6B. This is based on the reason described below. That is, the boosted voltage VBOOST is increased to a voltage higher than the power supply voltage Vcc through a procedure described below, in response to the activation of the boost driving signal ATDBST. If any time margin necessary for the NMOS transistor T1 to be switched from a turn-on state to a turn-off state is not given, there is a time period during which the transistors T1 and T2 are in the conductive state so that a through current flows from the voltage switching circuit SW to the ground via the PMOS transistor T2 and the NMOS transistor T1. Thus, the small delay is given to prevent the charge contributing to the generation of the boosted voltage VBOOST from being lost.

Figure 6C:
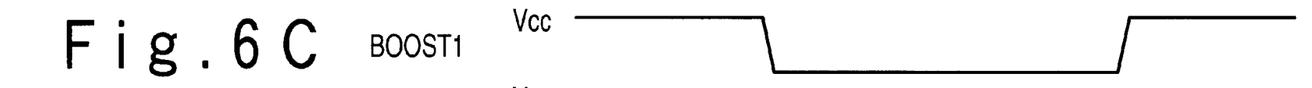
Figure 6D:
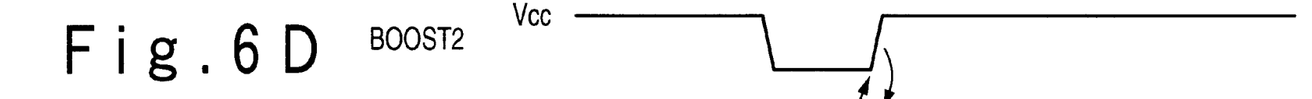

The boost driving signal ATDBST is a negative pulse. Therefore, the boost signal BOOST1 passed through the two inverters I3 and I4 is also a negative pulse, as shown in FIG. 6C. Also, since the boost stop signal BLIMT is set to the power supply voltage Vcc at the beginning as shown in FIG. 6F, the boost signal BOOST2 is a negative pulse as an output of the NAND gate NA which inputs the boost stop signal BLIMT and the output of the inverter I3, as shown in FIG. 6D.

Figure 6E:
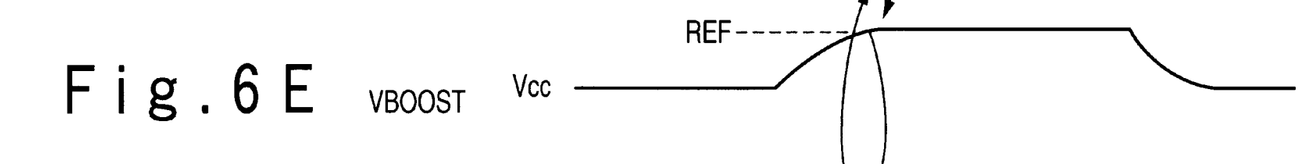

Based on the functions of the boost driving capacitances C1 and C2, the boosted voltage VBOOST is increased to the following voltage determined from the equation described above, as shown in FIG. 6E.

$$Vcc\left(1 + \frac{C_1 + C_2}{C_1 + C_2 + C_{out}}\right) \quad (2)$$

Figure 6F:
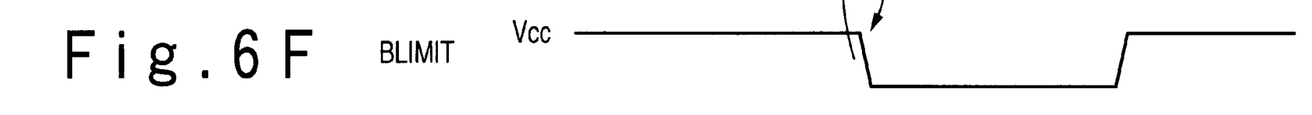
Figure 6G:
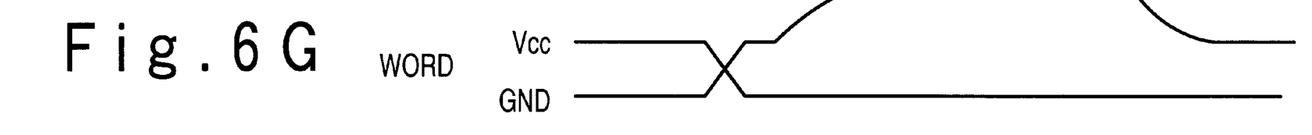

When the boosted voltage VBOOST exceeds the reference voltage REF, the voltage detecting circuit 3 activates the boost stop signal BLIMT to have the negative pulse, as shown in FIG. 6F. For this reason, the NAND gate NA shifts back the boost signal BOOST2 to the power supply voltage Vcc and the inverter I2 stops the charging operation to the boost driving capacitance C2. As a result, only the boosting circuit unit 1 contributes to the generation of the boosted voltage VBOOST. Therefore, the rising curve of the boosted voltage VBOOST is made gentle. In this case, the capacitance C2 may function as additional load capacitance to the load capacitance Cout. Thus, the rising curve of the boosted voltage VBOOT can be made further gentle.

In this way, it can be prevented without loss of the charge for the boosted voltage VBOOST for the word voltage VWORD to be boosted to a undesirable voltage. This is because the boosted voltage VBOOST is lowered back to the power supply voltage level Vcc when the ATD circuit AT deactivates the boost driving signal ATDBST. Therefore, unlike the conventional example in which any charge is lost, there is no case that the boosted voltage VBOOST is decreased to a voltage lower than the power supply voltage Vcc.

The present invention has an arrangement in which the outputs of the plurality of boosting circuit units are connected to produce the boosted voltage. Also, when the boosted voltage exceeds a predetermined voltage, the function of a part of the boosting circuit units is controlled to be limited. Therefore, the boosted voltage with less voltage change can be obtained. Also, since the present invention is configured not to form a current path in keeping the boosted voltage in the state of the less voltage change, the charge used for generation of the boosted voltage is not lost. Thus, the boosted voltage is readily shifted back to its initial voltage upon the boost resetting. For these reason, the time required for the resetting operation and the precharging operation can be shortened. Therefore, the semiconductor memory device can be realized to have high-speed operationality and high reliability.

What is claimed is:

1. A boosting circuit comprising:
    a plurality of boosting circuit units having their outputs connected together and respectively having voltage boosting functions, for generating a boosted voltage higher than a power supply voltage in response to a drive signal;
    voltage detecting circuit for detecting whether or not said boosted voltage is higher than a predetermined voltage, to generate a voltage control signal when it is detected that said boosted voltage is higher than said predetermined voltage; and
    a boost control circuit for limiting said voltage boosting functions of at least a predetermined boosting circuit unit of said plurality of boosting circuit units in response to said voltage control signal,
    wherein at least a remaining boosting circuit unit of said plurality of boosting circuit units other than said predetermined boosting circuit unit continues to perform said voltage boosting functions.

2. The boosting circuit according to claim 1, wherein said plurality of boosting circuit units comprise first and second boosting circuit units, and wherein said second boosting circuit unit is said predetermined boosting circuit unit.

3. A boosting circuit comprising:

a plurality of boosting circuit units having their outputs connected together and respectively having voltage boosting functions, for generating a boosted voltage higher than a power supply voltage in response to a drive signal;

a voltage detecting circuit for detecting whether or not said boosted voltage is higher than a predetermined voltage, to generate a voltage control signal when it is detected that said boosted voltage is higher than said predetermined voltage; and a boost control circuit for limiting said voltage boosting functions of at least a predetermined boosting circuit unit of said plurality of boosting circuit units in response to said voltage control signal, wherein said plurality of boosting circuit units comprise first and second boosting circuit units, and wherein said second boosting circuit unit is said predetermined boosting circuit unit, and wherein said first boosting circuit unit includes a first capacitor having a first capacitance and said second boosting circuit unit includes a second capacitor having a second capacitance, wherein said first and second capacitors are used for said voltage boosting functions, and said first capacitance is larger than said second capacitance.

4. A boosting circuit comprising:

a plurality of boosting circuit units having their outputs connected together and respectively having voltage boosting functions, for generating a boosted voltage higher than a power supply voltage in response to a drive signal;

a voltage detecting circuit for detecting whether or not said boosted voltage is higher than a predetermined voltage, to generate a voltage control signal when it is detected that said boosted voltage is higher than said predetermined voltage; and a boost control circuit for limiting said voltage boosting functions of at least a predetermined boosting circuit unit of said plurality of boosting circuit units in response to said voltage control signal, wherein said plurality of boosting circuit units comprise first, second, and third boosting circuit units, and said predetermined boosting circuit unit is said third boosting circuit unit.

5. The boosting circuit according to claim 4, wherein said first, second, and third boosting circuit units have capacitors which have a same capacitance.

6. The boosting circuit according to claim 1, wherein said boost control circuit stops said voltage boosting functions of said predetermined boosting circuit unit to limit said voltage boosting functions.

7. The boosting circuit according to claim 1, wherein said boosting circuit is contained in a semiconductor memory device having word lines for a memory cell array, and said drive signal is generated in response to switching of an address, and said boosted voltage is applied to one of said word lines corresponding to said address.

8. A method of boosting a voltage comprising:

generating a boosting voltage higher than a power supply voltage in response to a drive signal by a plurality of boosting circuit units having their outputs connected together and respectively having voltage boosting functions;

detecting whether or not said boosted voltage is higher than a predetermined voltage, to generate a voltage control signal when it is detected that said boosted voltage is higher than said predetermined voltage; and limiting said voltage boosting functions of at least a predetermined boosted circuit unit of said plurality of boosting circuit units in response to said voltage control signal, wherein said limiting operation includes continuing to perform said voltage boosting functions in at least a remaining boosting circuit of said plurality of boosting circuit units other than said predetermined boosting circuit unit.

9. A method of boosting a voltage, comprising:

generating a boosting voltage higher than a power supply voltage in response to a drive signal by a plurality of boosting circuit units having their outputs connected together and respectively having voltage boosting functions;

detecting whether or not said boosted voltage is higher than a predetermined voltage, to generate a voltage control signal when it is detected that said boosted voltage is higher than said predetermined voltage; and limiting said voltage boosting functions of at least a predetermined boosted circuit unit of said plurality of boosting circuit units in response to said voltage control signal, wherein said plurality of boosting circuit units comprise first and second boosting circuit units, and said second boosting circuit unit is said predetermined boosting circuit unit, wherein said first boosting circuit includes a first capacitor having a first capacitance and said second boosting circuit unit includes a second capacitor having a second capacitance, and wherein said first and second capacitors perform said voltage boosting functions, and said first capacitance is larger than said second capacitance.

10. A method of boosting a voltage, comprising:

generating a boosting voltage higher than a power supply voltage in response to a drive signal by a plurality of boosting circuit units having their outputs connected together and respectively having voltage boosting functions;

detecting whether or not said boosted voltage is higher than a predetermined voltage, to generate a voltage control signal when it is detected that said boosted voltage is higher than said predetermined voltage; and limiting said voltage boosting functions of at least a predetermined boosted circuit unit of said plurality of boosting circuit units in response to said voltage control signal, wherein said plurality of boosting circuit units comprise first, second, and third boosting circuit units, and said predetermined boosting circuit unit is said third boosting circuit unit, and wherein said first, second, and third boosting circuit units have capacitors which have a same capacitance.

11. The method according to claim 8, wherein said limiting operation includes stopping said voltage boosting functions of said predetermined boosting circuit unit.

12. The method according to claim 8, wherein said boosting circuit is contained in a semiconductor memory device having word lines for a memory cell array, and
said method further comprising:
generating said drive signal in response to switching of an address; and
applying said boosted voltage to one of said word lines corresponding to said address.

13. A boosting circuit comprising:
a plurality of boosting circuit units each of which includes a capacitor, and whose outputs are connected together, wherein said capacitors are used for a voltage boosting function to generate a boosted voltage higher than a power supply voltage in response to a drive signal to charge a load capacitor;
a voltage detecting circuit for detecting whether or not said boosted voltage is higher than a predetermined voltage, to generate a voltage control signal when it is detected that said boosted voltage is higher than said predetermine voltage; and
a boost control circuit for limiting said voltage boosting functions of at least a predetermined boosting circuit unit of said plurality of boosting circuit units in response to said voltage control signal, such that said capacitor of said predetermined boosting circuit unit is operated as an additional load capacitor to be charged with the boosted voltage,
wherein at least a remaining boosting circuit unit of said plurality of boosting circuit units other than said predetermined boosting circuit unit continues to perform said voltage boosting functions.

14. The boosting circuit according to claim 13, wherein said plurality of boosting circuit units comprise first and second boosting circuit units, and said second boosting circuit unit is said predetermined boosting circuit unit.

15. A boosting circuit, comprising:
a plurality of boosting circuit units each of which includes a capacitor, and whose outputs are connected together, wherein said capacitors are used for a voltage boosting function to generate a boosted voltage higher than a power supply voltage in response to a drive signal to charge a load capacitor;
a voltage detecting circuit for detecting whether or not said boosted voltage is higher than a predetermined voltage, to generate a voltage control signal when it is detected that said boosted voltage is higher than said predetermine voltage; and
a boost control circuit for limiting said voltage boosting functions of at least a predetermined boosting circuit unit of said plurality of boosting circuit units in response to said voltage control signal, such that said capacitor of said predetermined boosting circuit unit is operated as an additional load capacitor to be charged with the boosted voltage,
wherein said plurality of boosting circuit units comprise first and second boosting circuit units, and said second boosting circuit unit is said predetermined boosting circuit unit, and
wherein said first boosting circuit unit includes a first capacitor having a first capacitance and said second boosting circuit unit includes a second capacitor having a second capacitance, and said first capacitance is larger than said second capacitance.

16. A boosting circuit, comprising:
a plurality of boosting circuit units each of which includes a capacitor, and whose outputs are connected together, wherein said capacitors are used for a voltage boosting function to generate a boosted voltage higher than a power supply voltage in response to a drive signal to charge a load capacitor;
a voltage detecting circuit for detecting whether or not said boosted voltage is higher than a predetermined voltage, to generate a voltage control signal when it is detected that said boosted voltage is higher than said predetermine voltage; and
a boost control circuit for limiting said voltage boosting functions of at least a predetermined boosting circuit unit of said plurality of boosting circuit units in response to said voltage control signal, such that said capacitor of said predetermined boosting circuit unit is operated as an additional load capacitor to be charged with the boosted voltage,
wherein said plurality of boosting circuit units comprise first, second, and third boosting circuit units, and said predetermined boosting circuit unit is said third boosting circuit unit.

17. The boosting circuit according to claim 16, wherein said first, second, and third boosting circuit units have capacitors which have a same capacitance.

18. The boosting circuit according to claim 13, wherein said boost control circuit stops said voltage boosting functions of said predetermined boosting circuit unit to limit said voltage boosting functions.

19. The boosting circuit according to claim 13, wherein said boosting circuit is contained in a semiconductor memory device having word lines for a memory cell array, and
said drive signal is generated in response to switching of an address, and
said boosted voltage is applied to one of said word lines correspond to said address.

20. A boosting circuit comprising:
a first boosting circuit that outputs a first voltage via a first output;
a second boosting circuit that outputs a second voltage via a second output, wherein said first and second outputs are at least indirectly connected together so that a boosted voltage is formed based on said first voltage and said second voltage;
a voltage detecting circuit that detects whether or not said boosted voltage is higher than a predetermined voltage and generates a voltage control signal when said boosted voltage is higher than said predetermined voltage; and
a boost control circuit that limits said second voltage output from said second boosting circuit in response to said voltage control signal,
wherein said boosted voltage continues to be formed from said first voltage output from said first boosting circuit when said boost control circuit limits said second voltage output from said second boosting circuit.

21. A boosting circuit, comprising:
a first boosting circuit that outputs a first voltage via a first output;
a second boosting circuit that outputs a second voltage via a second output, wherein said first and second outputs are at least indirectly connected together so that a boosted voltage is formed based on said first voltage and said second voltage;

a voltage detecting circuit that detects whether or not said boosted voltage is higher than a predetermined voltage and generates a voltage control signal when said boosted voltage is higher than said predetermined voltage; and a boost control circuit that limits said second voltage output from said second boosting circuit in response to said voltage control signal, wherein said first boosting circuit comprises a first capacitor having a first capacitance and said second boosting circuit comprises a second capacitor having a second capacitance, wherein said first capacitor is used to create said first voltage and said second capacitor is used to create said second voltage, and wherein said first capacitance of said first capacitor is larger than said second capacitance of said second capacitor.

22. A boosting circuit, comprising:

a first boosting circuit that outputs a first voltage via a first output;

a second boosting circuit that outputs a second voltage via a second output, wherein said first and second outputs are at least indirectly connected together so that a boosted voltage is formed based on said first voltage and said second voltage;

a voltage detecting circuit that detects whether or not said boosted voltage is higher than a predetermined voltage and generates a voltage control signal when said boosted voltage is higher than said predetermined voltage;

a boost control circuit that limits said second voltage output from said second boosting circuit in response to said voltage control signal; and a third boosting circuit that outputs a third voltage via a third output, wherein said first, second, and third outputs are at least indirectly connected together so that said boosted voltage is formed based on said first, second, and third voltages.

23. The boosting circuit as claimed in claim 22, wherein said first, second, and third boosting circuits comprise first, second, and third capacitors having first, second, and third capacitances, respectively, wherein said first, second, and third capacitors are used to create said first, second, and third voltages, respectively, and wherein said first, second, and third capacitances are substantially equal.

24. A boosting circuit, comprising:

a first boosting circuit that outputs a first voltage via a first output;

a second boosting circuit that outputs a second voltage via a second output, wherein said first and second outputs are at least indirectly connected together so that a boosted voltage is formed based on said first voltage and said second voltage;

a voltage detecting circuit that detects whether or not said boosted voltage is higher than a predetermined voltage and generates a voltage control signal when said boosted voltage is higher than said predetermined voltage;

a boost control circuit that limits said second voltage output from said second boosting circuit in response to said voltage control signal, wherein said second boosting circuit comprises:

a first gate that inputs a first boosting signal and outputs a first gated boosting signal; and a first capacitor that at least indirectly inputs said first gated boosting signal and at least indirectly outputs said second voltage.

25. The boosting circuit as claimed in claim 24, wherein said boost control circuit comprises:

a control gate that at least indirectly inputs a drive signal and said voltage control signal and at least indirectly outputs said first boosting signal based on a predetermined relationship between said drive signal and said voltage control signal.

26. The boosting circuit as claimed in claim 25, wherein said first gate is an inverter and said control gate is a NAND gate.

27. A boosting circuit, comprising:

a first boosting circuit that outputs a first voltage via a first output;

a second boosting circuit that outputs a second voltage via a second output, wherein said first and second outputs are at least indirectly connected together so that a boosted voltage is formed based on said first voltage and said second voltage;

a voltage detecting circuit that detects whether or not said boosted voltage is higher than a predetermined voltage and generates a voltage control signal when said boosted voltage is higher than said predetermined voltage;

a boost control circuit that limits said second voltage output from said second boosting circuit in response to said voltage control signal, wherein said first boosting circuit comprises:

a first gate that inputs a first boosting signal and outputs a first gated boosting signal; and a first capacitor that at least indirectly inputs said first gated boosting signal and at least indirectly outputs said first voltage, and wherein said second boosting circuit comprises:

a second gate that inputs a second boosting signal and outputs a second gated boosting signal; and a second capacitor that at least indirectly inputs said second gated boosting signal and at least indirectly outputs said second voltage.

28. The boosting circuit as claimed in claim 27, wherein said boost control circuit inputs a drive signal and said voltage control signal outputs said first boosting signal based on said drive signal, and wherein said boost control circuit outputs said second boosting signal based on a predetermined relationship between said drive signal and said voltage control signal.

29. The boosting circuit as claimed in claim 28, wherein said boost control circuit comprises:

a control gate that at least indirectly inputs said drive signal and said voltage control signal and at least indirectly outputs said second boosting signal based on said predetermined relationship between said drive signal and said voltage control signal.

30. The boosting circuit as claimed in claim 29, wherein said first gate is an inverter, said second gate is an inverter, and said control gate is a NAND gate.

31. A method of boosting a voltage comprising:

outputting a first voltage from a first output of a first boosting circuit;

outputting a second voltage from a second output of a second boosting circuit;

forming a boosted voltage based on said first voltage and said second voltage;

detecting whether or not said boosted voltage is higher than a predetermined voltage;

generating a voltage control signal when said boosted voltage is higher than said predetermined voltage; and limiting said second voltage output from said second boosting circuit in response to said voltage control signal, wherein said boosted voltage continues to be formed from said first voltage output from said first boosting circuit when said second voltage output from said second boosting circuit is limited.

32. A method of boosting a voltage, comprising:

outputting a first voltage from a first output of a first boosting circuit;

outputting a second voltage from a second output of a second boosting circuit;

forming a boosted voltage based on said first voltage and said second voltage;

detecting whether or not said boosted voltage is higher than a predetermined voltage;

generating a voltage control signal when said boosted voltage is higher than said predetermined voltage;

limiting said second voltage output from said second boosting circuit in response to said voltage control signal; and outputting a third voltage from a third output of a third boosting circuit, wherein said boosted voltage is formed based on said first, second, and third voltages.

33. A method of boosting a voltage, comprising:

outputting a first voltage from a first output of a first boosting circuit;

outputting a second voltage from a second output of a second boosting circuit;

forming a boosted voltage based on said first voltage and said second voltage;

detecting whether or not said boosted voltage is higher than a predetermined voltage;

generating a voltage control signal when said boosted voltage is higher than said predetermined voltage;

limiting said second voltage output from said second boosting circuit in response to said voltage control signal;

inputting a first boosting signal to a first gate of said second boosting circuit and outputting a first gated boosting signal from said first gate; and at least indirectly inputting said first gated boosting signal to a first capacitor of said second boosting circuit and at least indirectly outputting said second voltage from said first capacitor.

34. The method as claimed in claim 33, further comprising:

at least indirectly inputting a drive signal and said voltage control signal to a control gate of a boost control circuit;

at least indirectly outputting said first boosting signal from said control gate based on a predetermined relationship between said drive signal and said voltage control signal.

35. The method as claimed in claim 34, wherein said first gate is an inverter and said control gate is a NAND gate.

36. A method of boosting a voltage, comprising:

outputting a first voltage from a first output of a first boosting circuit;

outputting a second voltage from a second output of a second boosting circuit;

forming a boosted voltage based on said first voltage and said second voltage;

detecting whether or not said boosted voltage is higher than a predetermined voltage;

generating a voltage control signal when said boosted voltage is higher than said predetermined voltage;

limiting said second voltage output from said second boosting circuit in response to said voltage control signal;

inputting a first boosting signal to a first gate of said first boosting circuit and outputting a first gated boosting signal from said first gate;

at least indirectly inputting said first gated boosting signal to a first capacitor and at least indirectly outputting said first voltage from said first capacitor;

inputting a second boosting signal to a second gate of said second boosting circuit and outputting a second gated boosting signal from said second gate; and at least indirectly inputting said second gated boosting signal to a second capacitor and at least indirectly outputting said second voltage from said second capacitor.

37. The method as claimed in claim 36, further comprising:

inputting a drive signal and said voltage control signal to a boost control circuit;

outputting said first boosting signal from said boost control circuit based on said drive signal, and outputting said second boosting signal from said boost control signal based on a predetermined relationship between said drive signal and said voltage control signal.

* * * * *